United States Patent
Questad et al.

[11] Patent Number: 6,084,299
[45] Date of Patent: Jul. 4, 2000

[54] INTEGRATED CIRCUIT PACKAGE INCLUDING A HEAT SINK AND AN ADHESIVE

[75] Inventors: David Lee Questad, Vestal; Anne Marie Quinn, Kirkwood; George Henry Thiel, Endicott; Donna Jean Trevitt, Vestal; Tien Yue Wu; Patrick Robert Zippetelli, both of Endwell, all of N.Y.

[73] Assignee: International Business Machines Corporation, Armonk, N.Y.

[21] Appl. No.: 08/555,593

[22] Filed: Nov. 9, 1995

[51] Int. Cl.⁷ .............................. H01L 23/10; H01L 23/48
[52] U.S. Cl. ........................ 257/707; 257/706; 257/783
[58] Field of Search ................................. 257/706, 707, 257/783

[56] References Cited

U.S. PATENT DOCUMENTS

| | | |
|---|---|---|
| 4,759,970 | 7/1988 | Seeger, Jr. et al. . |
| 4,897,508 | 1/1990 | Mahulikar et al. ................ 174/52.4 |
| 4,975,761 | 12/1990 | Chu . |
| 5,012,322 | 4/1991 | Guillotte et al. ................ 257/783 |
| 5,026,748 | 6/1991 | Adams et al. . |
| 5,367,196 | 11/1994 | Mahulikar et al. ................ 257/797 |
| 5,369,058 | 11/1994 | Burns et al. . |
| 5,601,675 | 2/1997 | Hoffmeyer et al. ................ 156/94 |

FOREIGN PATENT DOCUMENTS

| | | | |
|---|---|---|---|
| 61-218139 | 9/1986 | Japan ................ 257/783 |
| 1-158782 | 6/1989 | Japan ................ 257/783 |
| 5-175380 | 7/1993 | Japan ................ 257/707 |
| 88/03705 | 5/1988 | WIPO ................ 257/783 |

*Primary Examiner*—Teresa M. Arroyo
*Attorney, Agent, or Firm*—William N. Hogg

[57] ABSTRACT

The bond strength between a semiconductor chip and a metal heat sink in an integrated circuit package can be improved by using an adhesive system comprising two separate layers, one layer exhibiting preferential bonding strength for the chip and the other layer exhibiting preferential bonding strength for the metal heat sink.

13 Claims, 2 Drawing Sheets

6,084,299

INTEGRATED CIRCUIT PACKAGE INCLUDING A HEAT SINK AND AN ADHESIVE

BACKGROUND OF THE INVENTION

The present invention relates to an improved integrated circuit package including a semiconductor chip, a metal heat sink and an electrically-insulating adhesive bonding the chip to the metal heat sink.

Modern integrated circuit packages oftentimes include semiconductor dies or chips bonded to a metal heat sink. Typically, the metal heat sink is carried on or by an electrically insulating carrier made from an epoxy resin or other plastic. In order to secure the chip in place, a glob of another epoxy or other resin is used to encapsulate the chip as well as any metal wires present for electrically connecting the chip to leads on the carrier.

In order to securely bond the chip to the metal heat sink, an electrically-insulating adhesive is used. Since the function of the metal heat sink is to absorb heat generated in the chip, this adhesive must exhibit a high thermal conductivity. In addition, this adhesive must also exhibit a high bond strength to the material forming the chip, most typically silicon, as well as a high bond strength to the metal forming the metal heat sink.

As modern chips become larger and larger, both in terms of size as well as power consumed, the stresses put on the chip/heat sink bond become greater and greater. As a result delamination of the chip from the heat sink is a growing problem in the industry today.

Accordingly, there is a need for a new bonding system for bonding a semiconductor chip to a metal heat sink which can accommodate the high stresses and heat involved in modern integrated circuit package designs and yet is still simple and inexpensive to carry out.

SUMMARY OF THE INVENTION

In accordance with the present invention, a new bonding system is provided for bonding a metal heat sink to a semiconductor chip, this adhesive system comprising a first adhesive layer bonded to the chip and a second adhesive layer bonded to the metal heat sink, the second adhesive exhibiting a higher bonding strength to the metal of the heat sink than the first adhesive, a lower modulus of elasticity than the first adhesive, or both.

In accordance with the present invention, it has been determined that the normal cause for rupture of the chip/heat sink bond in conventional integrated circuit packages is delamination at the metal/adhesive interface. In addition, it has been further determined that this problem can be avoided by interposing between the heat sink and the thermal adhesive normally used for bonding the chip to the heat sink another adhesive exhibiting a higher bonding strength for the metal of the heat sink, a lower modulus of elasticity, or both.

Because two layers of adhesive are used in accordance with the present invention, these adhesives can be tailored for adhesion to the chip and adhesion to the metal heat sink, respectively. This enables superior bonding systems to be produced, since the constraint characterizing adhesives used in prior art packages—namely that they bond well to both the chip and the metal sink—has been avoided. Furthermore, use of a second adhesive with a lower modulus of elasticity introduces greater flexibility in the overall chip/heat sink bond, thereby allowing larger stresses to be accommodated without rupture. Each of these features results in significantly reduced costs, since a much broader range of adhesives can be used in formulating the inventive bonding system than in prior art systems.

BRIEF DESCRIPTION OF THE DRAWINGS

The present invention may be more readily understood by reference to the drawings wherein.

DETAILED DESCRIPTION

Figure 1A:
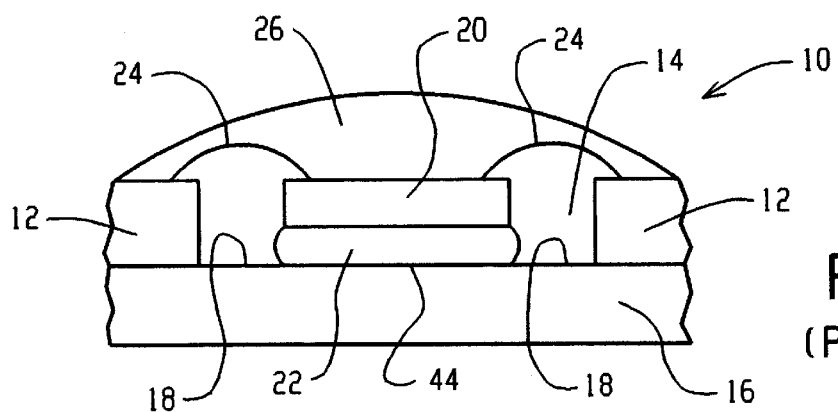
FIG. 1(a) is an elevational view of a prior art integrated circuit package with a cavity design wherein a single layer of thermal adhesive bonds the chip to the heat sink.
Figure 1B:
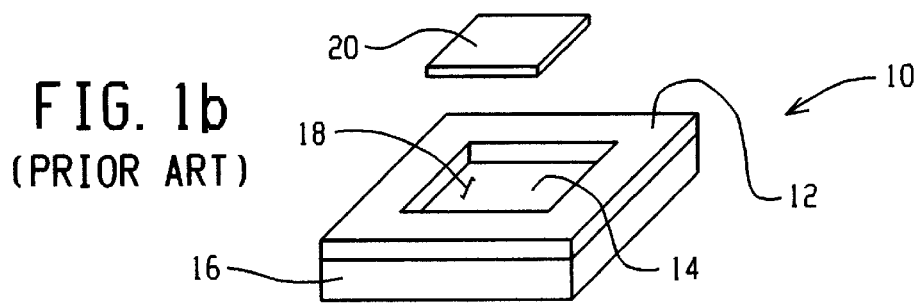
FIG. 1(b) is a partial, exploded perspective view of the integrated circuit package of FIG. 1(a)

FIG. 1(a) and FIG. 1(b) illustrate a conventional integrated circuit package with a cavity design, generally indicated at 10. In this package, a carrier 12 is provided, carrier 12 defining a chip cavity 14 therein. Carrier 12 may be formed from plastic such as epoxy resin or other thermoplastic or thermosetting resin and may be filled with appropriate fillers such as fiberglass and the like. Alternatively, carrier 12 can be formed from a ceramic material. Carrier 12 may also include internal electrical connectors such as power planes, plated-through-holes, vias and the like. In the embodiment shown, carrier 12 includes metal contact pads and electrical circuitry on the upper surface thereof (not shown) for electrical connection to a chip, as described below.

A heat sink 16 is bonded to the bottom surface of carrier 12 by means of a suitable adhesive layer (not shown). Heat sink 16 may be made from any conventional metal, such as copper, nickel or aluminum, which is typically provided with a surface treatment such as an anodized or chromate conversion layer. In the embodiment shown, heat sink 16 is substantial in size and thereby exhibits a stiffening or structural function in integrated circuit package 10.

Metal heat sink 16 defines a chip receiving surface 18 thereon which is open to cavity 14 in carrier 12. A chip 20 is located in cavity 14 and is securely bonded to heat sink 16 by means of a layer of thermal adhesive 22 which may be an epoxy resin or other material. Metal wires 24 electrically connect chip 20 to electrical connectors (not shown) on carrier 12 for electrically connecting chip 20 to other circuitry in the device in which it is used. A glob 26 of an encapsulating material such is an epoxy resin encapsulates chip 20, metal wires 24 and the portions of carrier 12 where metal wires 24 are attached. In the embodiment shown, glob 26 extends downwardly to and touches the portion of chip receiving surface 18 not covered by thermal adhesive 22.

Figure 2A:
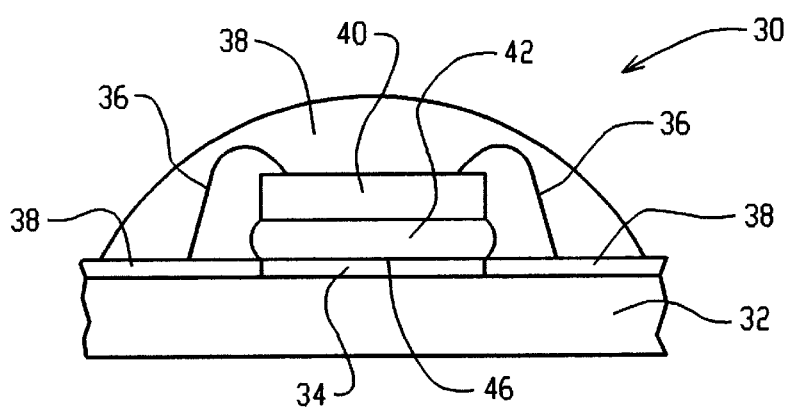
FIG. 2(a) is an elevational view of a prior art integrated circuit package with a non-cavity design wherein a single layer of thermal adhesive bonds the chip to a metal heat sink pad.
Figure 2B:
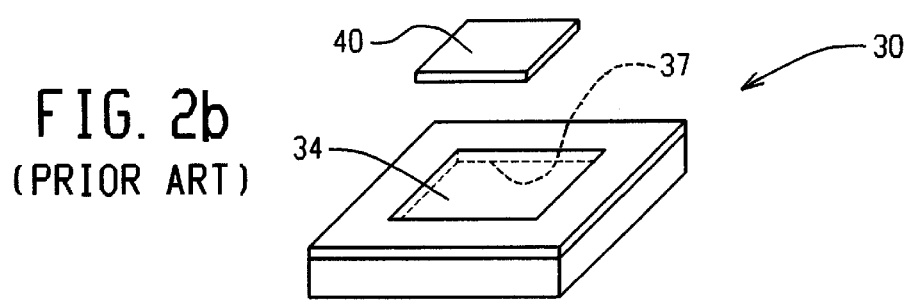
FIG. 2(b) is a partial, exploded perspective view of the integrated circuit package of FIG. 2(a)

Another prior art integrated circuit package of a some what different design is illustrated in FIGS. 2(a) and 2(b). In this integrated circuit package, generally indicated at 30, a carrier 32 supports a metal heat sink in the form of a pad 34 which is carried in an opening 37 in a solder mask 38 carried on an upper surface of carrier 32. As in the case of the integrated circuit package of FIGS. 1(a) and 1(b), carrier 32 can be composed of epoxy or other plastic or ceramic as desired. Preferably, it is composed of fiberglass-filled epoxy. In addition, carrier 32 may also include internal circuitry such as power planes, ground planes, electrical connection pins, plated-through-holes, contact pads and the like. In one embodiment, metal pad 34 may be electrically connected by metal connectors to power planes or grounding planes, these planes together with their electrical connections to pad 34 providing a further heat sink function in accordance known principles.

A semiconductor chip 40 is securely bonded to metal pad 34 by means of a layer 42 of thermal adhesive. Metal wires 37 electrically connect chip 40 with contacts (not shown) on carrier 32 for electrical connection of chip 40 into the device in which integrated circuit package is to be used.

In prior art designs such as illustrated in FIGS. 1(a), 1(b), 2(a) and 2(b), the thermal adhesives used (adhesive layers 22 and 42 in FIGS. 1(a) and 2(a) respectively) must exhibit at least three different properties, good thermal conductivity, good chip/adhesive bond strength and good metal/adhesive bond strength. This severely limits the choice of adhesives useful for this purpose, as there are comparatively few adhesives which exhibit each of these properties to the desired degree. Also, as modern chips become larger and larger, both in terms of size as well as power consumed, this constraint becomes only worse since the stresses involved in such larger chips become even greater. In practical terms, this has lead to significant difficulty in the design of integrated circuit packages generally, with delamination between the chip and the metal heat sink being a growing problem.

Figure 3A:
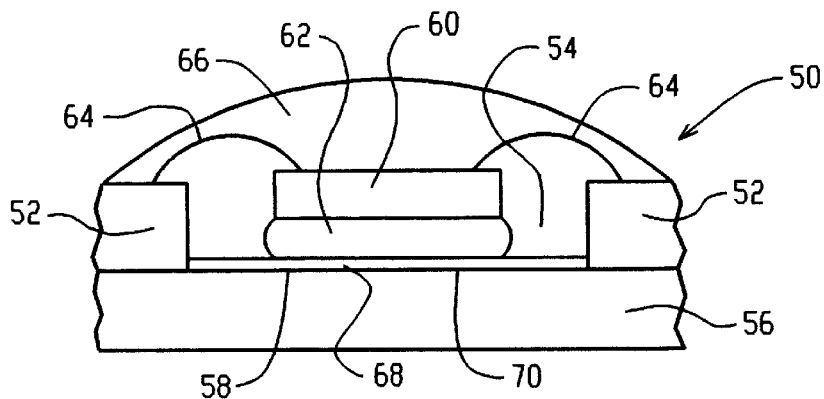
FIG. 3(a) is an elevational view of an integrated circuit package with a cavity design employing the adhesive system of the present invention.
Figure 3B:
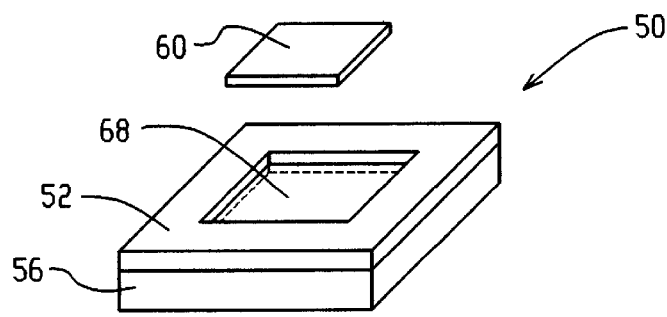
FIG. 3(b) is a partial, exploded perspective view of the integrated circuit package of FIG. 3(a)

In accordance with the present invention, this problem is avoided by using a bonding system composed of at least two layers, one layer being preferentially suited for bonding to the semiconductor chip and the other being preferentially suited for bonding to the metal heat sink. Referring to FIGS. 3(a) and 3(b), an integrated circuit package generally indicated at 50, similar in design to integrated circuit package 10 of FIG. 1(a), includes a carrier 52 defining a chip-receiving cavity 54 therein and a metal heat sink 56 securely bonded to carrier 52. Heat sink 56 defines a chip receiving surface 58 which is open to the bottom of cavity 54 in carrier 52. A chip 60 is received in cavity 54 and is bonded to heat sink 56 by means of a first layer of thermal adhesive 62. Metal wires 64 connect chip 60 with contacts (not shown) on carrier 52 and a glob of encapsulating material 66 encapsulates chip 60, metal wires 64, the portions of carrier 52 in contact with metal wires 64 and all of cavity 54 including that in contact with chip receiving surface 58 of heat sink 56.

In accordance with the present invention, a second adhesive layer 68 is interposed between chip receiving surface 58 of heat sink 56 and first adhesive layer 62. The adhesive of second adhesive layer 68 preferentially bonds to metal. In other words, it has a higher bonding strength to the metal forming metal heat sink 56 than does the adhesive forming first adhesive layer 62. By this means, delamination at metal/adhesive interface 70 defined at chip-receiving surface 58 of the heat sink is significantly reduced. This results in the inventive bonding system formed by first adhesive layer 62 and second adhesive layer 68 exhibiting an overall bonding strength between chip 60 and heat sink 56 significantly greater than in the case of the prior art package of FIGS. 1(a) and 1(b).

In an alternate embodiment of the invention, second adhesive layer 68 is made from an adhesive exhibiting a lower modulus of elasticity than the adhesive of first adhesive layer 62. With this structure, the inventive bonding system formed by first adhesive layer 62 and second adhesive layer 68 is able to accommodate greater lateral stress, i.e. stress acting in directions parallel to the adhesive/heat sink interface. This is because the greater flexibility of second adhesive layer 68 allows for greater lateral movement of the heat sink relative to the chip as compared to first adhesive layer 62 alone. This also translates to a "stronger" chip/heat sink bond, because the chip/heat sink package can accommodate a greater amount of power consumed and heat generated before rupture conditions are reached.

In still another embodiment of the invention, the adhesive of second adhesive layer 68 is selected to have a better metal bonding strength and a lower modulus of elasticity than the adhesive of first adhesive layer 62. In this case, the chip/heat sink bond strength is improved both because of a stronger metal/adhesive bond as well as because of a greater flexibility in the overall bonding system.

Thermal adhesives useful for adhering semiconductor chips to heat sinks are well known and any such thermal adhesive can be used in accordance with the present invention for forming each of first adhesive layer 62 and second adhesive layer 68. Examples of well known thermal adhesives are the epoxy resins, acrylic resins and silicone resins. Typically, these resins are filled to a greater or lesser degree with heat conducting fillers such as silver, alumina, aluminum nitrate or other particles, fibers or composites for improving thermal conductivity. Of course, the adhesive of second layer 68 should be selected to exhibit an enhanced bonding strength to the metal heat sink or a lower modulus of elasticity relative to first adhesive layer 62, since this fosters improved overall bond strength between chip 60 and heat sink 56, as mentioned above.

There is no particular requirement for the bonding strengths or moduli of elasticity of the adhesives selected for forming first adhesive layer 62 and second adhesive layer 68, since the conditions of interfacial stress and thermal loading encountered in a particular package design will vary depending on the nature and size of the chip and heat sink to be bonded. What is important, however, is that the adhesive of the second layer is selected to preferentially bond to the metal, (i.e. the adhesive of the second layer develops a higher bond strength to the metal forming the metal heat sink than does adhesive used to form the first layer), to exhibit a lower modulus of elasticity or both.

Because two separate adhesive layers are used in accordance with the present invention, the adhesive used for the first adhesive layer can be selected without regard for the bonding strength of this adhesive to metal, while the adhesive used for the second adhesive layer can be selected without regard for its bonding strength to the chip. Also, the requisite flexibility, or even added flexibility, of the chip/heat sink bond can be built into the inventive bonding system by preferentially selecting one of the two adhesives to exhibit the desired flexibility, thereby reducing flexibility as a constraint in selecting the other adhesive. As a result, more and better adhesive systems can be selected, because the two adhesives need not exhibit good bonding strength to both chip and metal, as well as acceptable moduli of elasticity, as in the case of prior art designs. This allows stronger and cheaper bonding systems to be developed than possible in the past.

In a preferred embodiment of the invention, the adhesives used in the first and second adhesive layers are selected so as to be compatible with one another. By being "compatible" with one another is meant that the bond strength developed between the first and second adhesive layers is at least as strong as the bond strengths of the first adhesive to the semiconductor and the second adhesive to the metal heat sink. Most adhesive systems used in integrated circuit packages will bond well to one another, far better than they bond to semiconductor chips or to metal substrates. Accordingly, this criteria of the adhesives being compatible will be met with most semiconductor adhesives used today. In any event, it is preferable in accordance with the present invention to avoid systems in which the adhesives of the first and second layers are incompatible with one another in the sense that the bond strength developed between the two layers is less than the bond strength at either the chip or the heat sink interface.

In accordance with a particularly preferred embodiment of the invention, the adhesives used for forming both the first adhesive layer and the second adhesive layer in a particular integrated circuit package are selected from the same resin family. By resin family is meant for example, epoxy, phenolics, polyamides, polyesters, acrylics, silicones, polyimides, etc.

In the most preferred embodiment, both the first adhesive layer and the second adhesive layer are formed from epoxy resin adhesives. Epoxy resin adhesives, particularly thermal epoxy resin adhesives (i.e. epoxy resin adhesives exhibiting high thermal conductivity) are well known in the art. Some of these adhesives are known as exhibiting high bond strength with respect to semiconductor chips, particularly those made from silicon, while other are known for exhibiting high bond strengths to metal. In the preferred embodiment of the invention, first adhesive layer 62 is made from a thermal epoxy resin exhibiting high bond strength to semiconductor chip 60, while second adhesive layer 68 is made from an epoxy resin system exhibiting high bond strength to metal. Examples of suitable combinations of adhesives for the first and second layers are as follows: 965 Epoxy/8213 Epoxy and 965 Epoxy/240 Epoxy. Epoxy 965 is a well-known silver metal-filled thermal epoxy resin available from Ablestik. Epoxy 8213 is a brominated epoxy creosol novalac resin exhibiting a high glass transition temperature and low moisture absorptivity which is optionally filled with copper powder for enhanced thermal conductivity and reduced coefficient of thermal expansion. Epoxy 240 is a thixotropic solvent-based epoxy novalac resin.

The thicknesses of first adhesive layer 62 and second adhesive layer 68 can vary widely, and essentially any thickness can be used. In this regard, care must be taken in selecting the thicknesses for the two adhesives layers to ensure that the adhesive system as a whole exhibits the necessary thermal conductivity for the conditions to be encountered.

In this connection, it should be understood that the primary function of second adhesive layer 68, when chosen for its improved metal bonding characteristics, is to enhance the strength of the bond between first adhesive layer 62 and heat sink 56. To this end, second adhesive layer 68 need only be as thick as is necessary to accomplish this function. In practice, thicknesses on the order of 10 to 20 microns have been found to be suitable, while thicknesses even less than ten microns are also possible. A particular advantage of the present invention is that, because second adhesive layer 68 can be so thin, it does not need to exhibit particularly good thermal conductivity. This is because a thin adhesive layer 68 does not represent a significant barrier to heat transfer, even if it does exhibit comparatively poor thermal conductivity. Accordingly, keeping second adhesive layer 68 as thin as possible allows the adhesive of second adhesive layer 68 to be selected not only without regard to its chip/adhesive bonding strength but also without significant concern for its thermal conductivity either. This provides further flexibility in the design of a specific bonding system for a particular application in that adhesives heretofore not useful for bonding chips to metal heat sinks can now be used for this purpose. This, in turn, leads to a still wider selection of materials being possible and hence even more improved products and reduced costs.

In the same way, the primary function of second adhesive layer 68, when chosen for its lower modulus of elasticity, is to increase the flexibility of the overall chip/heat sink bond, thereby allowing the bond to tolerate increased lateral movement between the chip and the heat sink before bond rupture. To this end, second adhesive layer 68 need only be thick enough in this embodiment to impart the desired flexibility to the chip/heat sink bond. As in the prior embodiment, this may be accomplished with a comparatively thin second adhesive layer 68 in particular applications, which also allows this adhesive to be chosen with little regard for its thermal conductivity.

A still further advantage of the present invention is that second adhesive layer 68, in addition to improving the bond strength of chip 60 to heat sink 56, also improves the bond strength of encapsulating glob 66 to heat sink 56. Another problem often encountered in integrated circuit packages of the designs illustrated in FIGS. 1(a), 1(b), 2(a) and 2(b) is that the glob 26, 38 of encapsulating material delaminates from its substrate, i.e. heat sink 16 in the integrated circuit package of FIGS. 1(a) and 1(b) and solder mask 38 from the integrated circuit package of FIGS. 2(a) and 2(b). This problem is avoided or at least minimized in accordance with the present invention, since second adhesive layer 68, FIGS. 3(a) and 3(b), significantly improves the bond strength of the encapsulating glob to its substrate.

Integrated circuit package of 50 of FIGS. 3(a) and 3(b) is manufactured in a similar manner to processes for forming conventional integrated circuit packages such as illustrated in FIGS. 1(a) and 1(b). In accordance with the invention, however, second adhesive layer 68 is interposed between heat sink 56 and first adhesive layer 62. This can be done in a number of different ways. For example, second adhesive layer 68 can be laid down on chip receiving surface 58 of heat sink 56 first, first adhesive layer 62 coated thereon and then chip 60 applied thereto. Alternatively, the two adhesive layers can be applied to the semiconductor chip before the chip is adhered to the heat sink. Alternatively, the first adhesive layer can be applied to the chip and the second adhesive layer applied to the heat sink before the two adhesive layers are brought together. Curing of the respective layers and encapsulant can occur at any time, as desired.

In accordance with a preferred embodiment of the invention, second adhesive layer 68 on chip receiving surface 58 of heat sink 56 represents part of the adhesive layer (not shown) bonding carrier 52 to heat sink 56. Thus, in this embodiment of the invention, an essentially continuous layer of second adhesive is applied across the upper surface of heat sink 56, after which carrier 52 is affixed thereto. After an optional curing step, first adhesive layer 62 is then applied to adhesive layer 68 in cavity 54 and chip 60 attached thereto in an otherwise conventional manner. This technique greatly simplifies manufacturing, since precise registering of second adhesive layer 68 on chip receiving surface 58 of heat sink 56 is avoided.

Figure 4A:
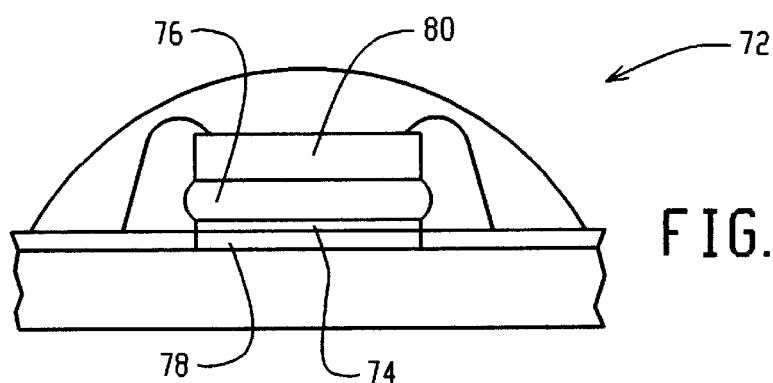
FIG. 4(a) is an elevational view of an integrated circuit package employing a non-cavity design and embodying the inventive adhesive system.
Figure 4B:
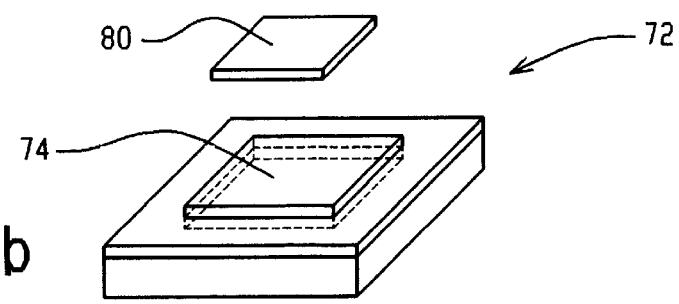
FIG. 4(b) is a partial, exploded perspective view of the integrated circuit package of FIG. 4(a).

FIGS. 4(a) and 4(b) illustrate another embodiment of the present invention in which integrated circuit package 72 has a structure similar to prior art integrated circuit package 30 of FIGS. 2(a) and 2(b). However, in integrated circuit package 72, second adhesive layer 74 is provided between first adhesive layer 76 and the metal heat sink in the form of contact pad 78. As in the previously described embodiment of the invention, second adhesive layer 74 in this integrated circuit package is also selected to preferentially bond to the metal forming heat sink 78 or to exhibit a lower modulus of elasticity than the adhesive of first adhesive layer 62, or both. This, again, causes the overall bond strength between chip 80 and heat sink 78 to be significantly greater than possible in accordance with prior art designs such as that illustrated in FIGS. 2(a) and 2(b).

Although only a few embodiments of the present invention have been illustrated above, it should be appreciated that many modifications can be made without departing from the spirit and scope of the invention. For example, the inventive bonding system can be selected so that the second adhesive layer, i.e. the adhesive in contact with the metal heat sink, exhibits the high thermal conductivity with the first adhesive layer being made small and thin merely for providing good adhesion of the first adhesive layer to the semiconductor chip, improved flexibility or both. Furthermore, one or more additional adhesive layers may be interposed between the first adhesive layer and the second adhesive layer, if desired, to provide even greater flexibility and improved bond strength to the inventive bonding system. All such modifications are intended to be included within the scope of the present invention, which is to be limited only by the following claims:

We claim:

1. An integrated circuit package comprising a semiconductor chip, a metal heat sink and an electrically-insulating adhesive bonding said chip to said heat sink, said adhesive comprising a first adhesive layer attached to said chip, said first adhesive layer being made from a first adhesive, and a second adhesive layer attached to said heat sink, said second adhesive layer being made from a second adhesive exhibiting a higher bonding strength to said heat sink than said first adhesive or a lower modulus of elasticity than said first adhesive or both;

said first and second adhesive layers being in contact with and bonded to each other.

2. The package of claim 1, wherein said heat sink is made from metal and further wherein said second adhesive exhibits a higher bonding strength for said metal than said first adhesive.

3. The package of claim 1, wherein said heat sink is metal and further wherein said second adhesive has a lower modulus of elasticity than said first adhesive.

4. The package of claim 1, wherein said first adhesive exhibits higher thermal conductivity than said second adhesive.

5. The package of claim 4, wherein said package further includes a carrier and a glob of an encapsulating material encapsulating said chip, said encapsulating material securing said chip with respect to said carrier.

6. The package of claim 5, wherein said heat sink defines a chip-receiving surface, wherein said carrier defines a chip cavity for receiving said chip therein, said chip cavity being open to said chip-receiving surface, wherein said carrier is bonded to said chip receiving surface, and wherein said encapsulating material secures said chip to said carrier.

7. The package of claim 6, wherein said second adhesive layer bonds said carrier to said heat sink.

8. The package of claim 6, wherein said heat sink is a contact pad carried on said carrier.

9. The package of claim 8, wherein package further includes a solder mask on said carrier, said encapsulating securing said chip to said solder mask.

10. The package of claim 1, wherein said first and said second adhesives are different materials selected from thermoplastic and thermosetting resins.

11. The package of claim 10, wherein said first adhesive is an epoxy and said second adhesive is an epoxy.

12. The package of claim 6 wherein said chip cavity and said chip define spaces therebetween, said encapsulating material filling said spaces.

13. An integrated circuit package comprising a semiconductor chip, a metal heat sink and an adhesive bonding the chip to the heat sink, the adhesive being electrically-insulating throughout its entire mass and comprising a first adhesive layer attached to the chip, the first adhesive layer being made from a first adhesive, and a second adhesive layer attached to the heat sink, the second adhesive layer being made from a second adhesive exhibiting a higher bonding strength to the heat sink than the first adhesive or a lower modulus of elasticity than the first adhesive or both;

said first and second adhesive layers being in contact with and bonded to each other.

* * * * *